US012733211B2

(12) United States Patent
Yeong et al.

(10) Patent No.: US 12,733,211 B2
(45) Date of Patent: Sep. 8, 2026

(54) MULTILAYER INNER SPACER FOR GATE-ALL-AROUND DEVICE

(71) Applicant: Applied Materials, Inc., Santa Clara, CA (US)

(72) Inventors: Sai Hooi Yeong, Cupertino, CA (US); Liu Jiang, Dublin, CA (US); Susmit Singha Roy, Campbell, CA (US); Abhijit Basu Mallick, Sunnyvale, CA (US); El Mehdi Bazizi, San Jose, CA (US); Benjamin Colombeau, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 281 days.

(21) Appl. No.: 18/383,182

(22) Filed: Oct. 24, 2023

(65) Prior Publication Data

US 2024/0194757 A1 Jun. 13, 2024

Related U.S. Application Data

(60) Provisional application No. 63/430,882, filed on Dec. 7, 2022.

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/014; H10D 30/43; H10D 30/6735; H10D 30/6757; H10D 62/121;
(Continued)

(56) References Cited

U.S. PATENT DOCUMENTS 10,014,390 B1 7/2018 Bouche et al.
10,243,060 B2 3/2019 Chao et al.
(Continued)

FOREIGN PATENT DOCUMENTS

TW 202205436 A 2/2022

OTHER PUBLICATIONS

PCT International Search Report and Written Opinion in PCT/US2023/035769 dated Feb. 13, 2024, 11 pages.

*Primary Examiner* — Monica D Harrison
(74) *Attorney, Agent, or Firm* — SERVILLA WHITNEY LLC

(57) ABSTRACT

Semiconductor devices (e.g., gate-all-around (GAA) devices), process tools for manufacturing GAA devices and methods of manufacturing GAA devices and multilayer inner spacers for GAA devices are described. The multilayer inner spacer comprises an inner layer, a middle layer, and an outer layer within a superlattice structure formed on a top surface of a substrate. The superlattice structure has a plurality of semiconductor material layers (e.g., silicon germanium (SiGe)) and a corresponding plurality of channel layers (e.g., silicon (Si)) alternatingly arranged in a plurality of stacked pairs. In some embodiments, the methods are performed in situ in an integrated deposition and etch processing system.

16 Claims, 12 Drawing Sheets

(51) Int. Cl.

| | |
|---|---|
| ***H10D 30/43*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.
CPC ....... *H10D 30/6757* (2025.01); *H10D 62/121* (2025.01); *H10D 64/017* (2025.01); *H10D 64/018* (2025.01); *H10D 84/0167* (2025.01); *H10D 84/0184* (2025.01); *H10D 84/038* (2025.01); *H10D 84/85* (2025.01)

(58) Field of Classification Search
CPC ............... H10D 64/017; H10D 64/018; H10D 84/0167; H10D 84/0184; H10D 84/038; H10D 84/85; H10D 30/031; H10D 64/671; H10D 64/015; H01L 21/67167; H01L 21/67184
USPC .......................................................... 257/288
See application file for complete search history.

(56) References Cited

U.S. PATENT DOCUMENTS

| | | | | |
|---|---|---|---|---|
| 10,553,679 | B2 | 2/2020 | Zhang et al. | |
| 12,040,383 | B2 * | 7/2024 | Lee | H10D 30/797 |
| 2017/0194430 | A1 | 7/2017 | Wood et al. | |
| 2019/0081155 | A1 | 3/2019 | Xie et al. | |
| 2020/0098860 | A1 | 3/2020 | Cheng et al. | |
| 2020/0381545 | A1 * | 12/2020 | Chiang | H10D 62/121 |
| 2021/0104617 | A1 | 4/2021 | Hung et al. | |
| 2021/0242327 | A1 | 8/2021 | Lin et al. | |
| 2021/0367063 | A1 | 11/2021 | Kao et al. | |
| 2022/0140151 | A1 | 5/2022 | Yeong et al. | |
| 2022/0246742 | A1 * | 8/2022 | Pal | H10D 30/6735 |
| 2023/0009745 | A1 * | 1/2023 | Lin | H10D 64/671 |

* cited by examiner 290
208
224
226
202
210
250
232/234
246

290
208
224
226
202
210
232/234
246

290
208
224
226
202
210
204
246

290
208
224
226
202
204
246

290
224
226
202
204
246

290

208

210

212A

224

226

224

226

224

MULTILAYER INNER SPACER FOR GATE-ALL-AROUND DEVICE

CROSS-REFERENCE TO RELATED APPLICATIONS

This application claims priority to U.S. Provisional Application No. 63/430,882, filed Dec. 7, 2022, the entire disclosure of which is hereby incorporated by reference herein.

TECHNICAL FIELD

Embodiments of the disclosure generally relate to semiconductor devices. More particularly, embodiments of the disclosure are directed to gate all around (GAA) devices and methods of forming GAA devices having a multilayer inner spacer.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

One of challenges in CMOS wafer manufacturing (and GAA formation) is reducing parasitic capacitance. Low-K dielectric materials for the inner spacer in GAA devices have been explored in attempt to reduce the parasitic capacitance and optimum speed for ring oscillators composed of GAA devices.

However, there is a trade-off between the K-value and the "sturdiness" of the inner spacer, at which the lower-value material experiences increased resistance to dry and/or wet etch processes, in particular, for GAA devices which requires to go through the nanosheet release process. Damage/penetration of inner spacer at the weak corner is one of the major yield detractors for GAA devices.

Accordingly, there is a need for methods of forming improved inner spacers for gate-all-around (GAA) devices.

SUMMARY

One or more embodiments of the disclosure are directed to a method of manufacturing an electronic device. In some embodiments, the method comprises: forming a multilayer inner spacer comprising an inner layer, a middle layer, and an outer layer within a superlattice structure formed on a top surface of a substrate. The superlattice structure comprises a plurality of semiconductor material layers and a corresponding plurality of channel layers alternatingly arranged in a plurality of stacked pairs. The plurality of semiconductor material layers comprises silicon germanium (SiGe) and the corresponding plurality of channel layers comprises silicon (Si). In some embodiments, forming the multilayer inner spacer comprises: depositing the inner layer on a recessed portion of the plurality of semiconductor material layers; depositing the middle layer on the inner layer; and depositing the outer layer on the middle layer, the outer layer adjacent a source region and a drain region.

Additional embodiments of the disclosure are directed to a method of manufacturing an electronic device. In some embodiments, the method comprises: forming a multilayer inner spacer comprising an inner layer, a middle layer, and an outer layer within a superlattice structure formed on a top surface of a substrate. The superlattice structure comprises a plurality of semiconductor material layers and a corresponding plurality of channel layers alternatingly arranged in a plurality of stacked pairs. The plurality of semiconductor material layers comprises silicon germanium (SiGe) and the corresponding plurality of channel layers comprises silicon (Si). In some embodiments, forming the multilayer inner spacer comprises: depositing the inner layer on a recessed portion of the plurality of semiconductor material layers; optionally etching the inner layer; depositing the middle layer on the inner layer; etching a portion of the middle layer; depositing the outer layer on the middle layer, the outer layer adjacent a source region and a drain region; and etching the outer layer.

Further embodiments of the disclosure are directed to a processing tool. In some embodiments, the processing tool comprises: a central transfer station comprising a robot configured to move a substrate; a plurality of process stations, each process station connected to the central transfer station and providing a processing region separated from processing regions of adjacent process stations, the plurality of process stations comprising a chemical vapor deposition (CVD) chamber and an etch chamber; and a controller connected to the central transfer station and the plurality of process stations. The controller is configured to activate the robot to move the substrate between process stations, and to control a process cycle for manufacturing a multilayer inner spacer for a gate-all-around (GAA) device. The multilayer inner spacer comprises an inner layer, a middle layer, and an outer layer within a superlattice structure formed on a top surface of the substrate. The superlattice structure comprises a plurality of semiconductor material layers and a corresponding plurality of channel layers alternatingly arranged in a plurality of stacked pairs. The plurality of semiconductor material layers comprises silicon germanium (SiGe) and the corresponding plurality of channel layers comprises silicon (Si). The process cycle for forming the multilayer inner spacer by a thermal chemical vapor deposition (CVD) process includes: depositing the inner layer on a recessed portion of the plurality of semiconductor material layers; depositing the middle layer on the inner layer; and depositing the outer layer on the middle layer, the outer layer adjacent a source region and a drain region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
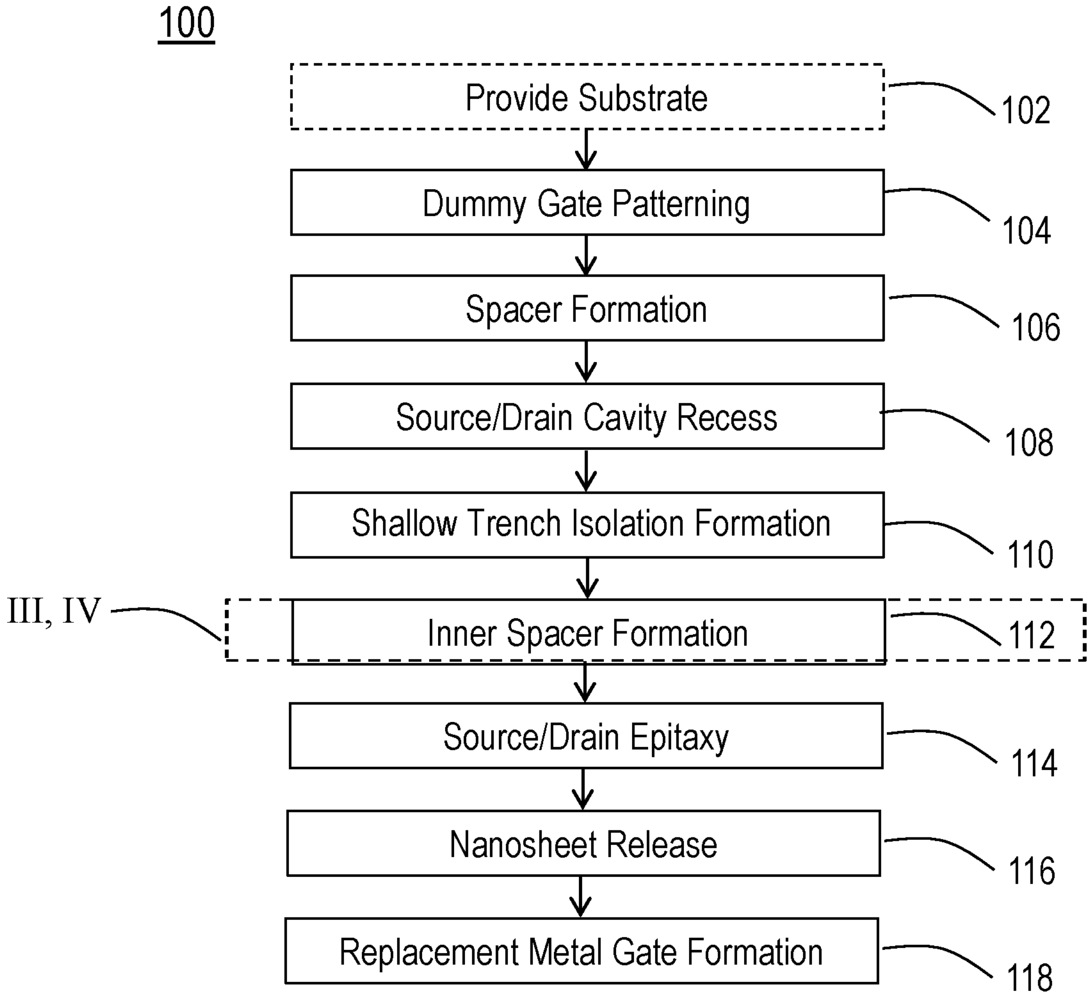
FIG. 1 illustrates a process flow diagram of a method of forming an electronic device according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor," "reactant," "reactive gas" and the like are used interchangeably to refer to any gaseous species that can react with the substrate surface.

As used herein, the term "in situ" refers to processes that are all performed in the same processing chamber or within different processing chambers that are connected as part of a processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated ID. Drain-to-source voltage is designated VDs. By applying voltage to gate (G), the current entering the channel at the drain (i.e., ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs, or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer (10-9 meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram of a method 100 for forming an electronic device (e.g., a gate-all-around device (GAA) 290) in accordance with some embodiments of the present disclosure. The method 100 is described below with respect to FIGS. 2A-2J, which depicts the stages of fabrication of semiconductor structures in accordance with some embodiments of the present disclosure. FIGS. 2A-2J illustrate cross-sectional views of the GAA device 290 according to one or more embodiments. The method 100 may be part of a multi-step fabrication process of a semiconductor device. Accordingly, the method 100 may be performed in any suitable process chamber coupled to a cluster tool, such as processing system 400 shown in FIG. 5. The processing system 400 may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figures 2A, 2B, 2C, 2D, 2E:
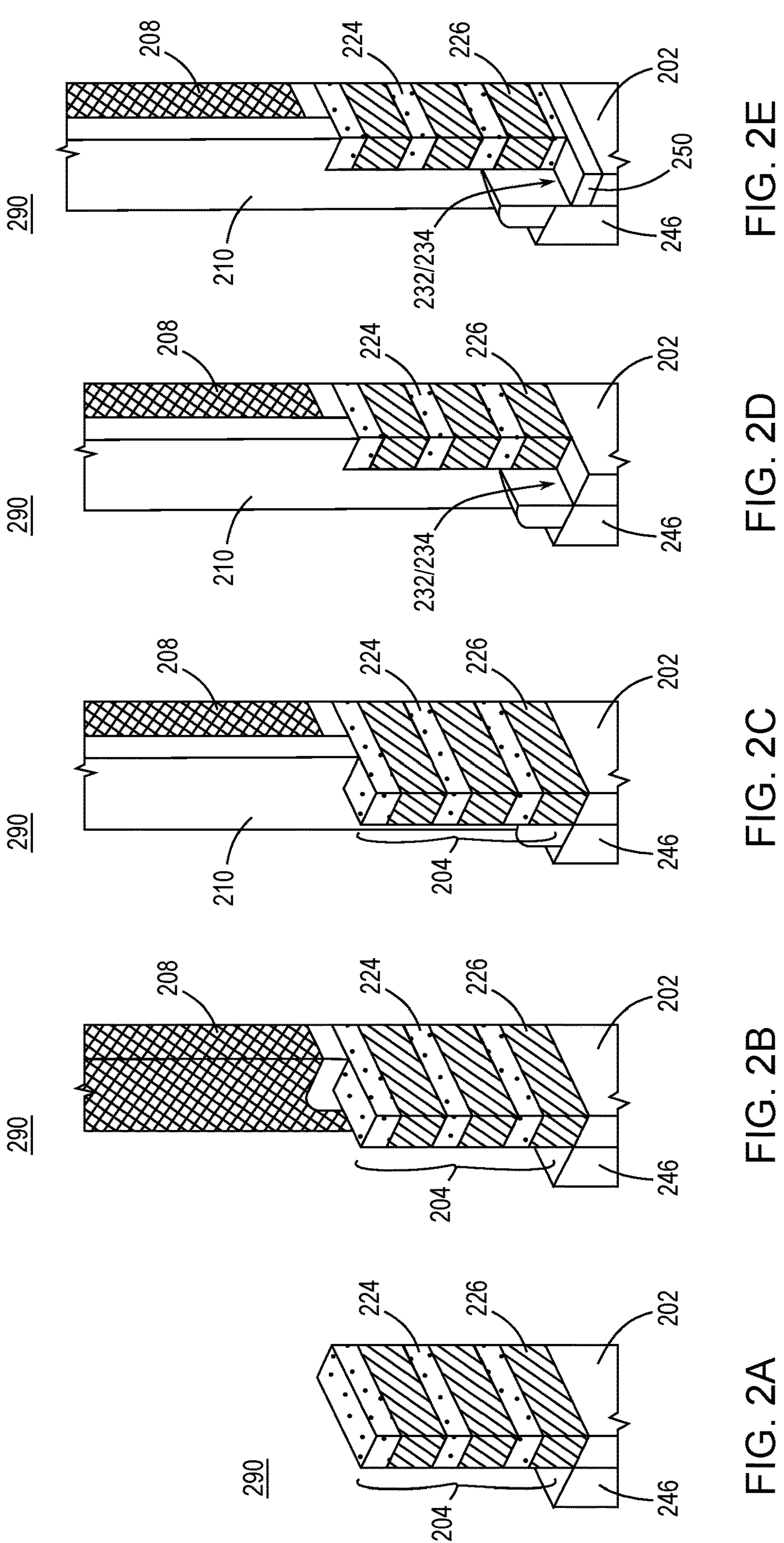
FIG. 2A illustrates a schematic cross-sectional view of an electronic device according to one or more embodiments.
FIG. 2B illustrates a schematic cross-sectional view of an electronic device according to one or more embodiments.
FIG. 2C illustrates a schematic cross-sectional view of an electronic device according to one or more embodiments.
FIG. 2D illustrates a schematic cross-sectional view of an electronic device according to one or more embodiments.
FIG. 2E illustrates a schematic cross-sectional view of an electronic device according to one or more embodiments.

The method 100 of forming the GAA device 290 begins at operation 102, by providing a substrate 200 having a top surface 202 (as illustrated in FIG. 2A). In some embodiments, the substrate 200 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 200 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 200 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate may be doped to provide a high dose of dopant at a first location of the surface of the substrate 200 in order to prevent parasitic bottom device turn on.

At least one superlattice structure 204 is formed atop the top surface 202 of the substrate 200 (as depicted in FIG. 2A). The superlattice structure 204 comprises a plurality of semiconductor material layers 226 and a corresponding plurality of channel layers 224 alternatingly arranged in a plurality of stacked pairs. In some embodiments the plurality of stacked groups of layers comprises a silicon (Si), germanium (Ge), or silicon germanium (SiGe) group. In some embodiments, the silicon germanium (SiGe) may contain germanium (Ge) in a mole fraction amount in a range of from 0% to 50%. In some embodiments, the plurality of semiconductor material layers 226 comprise silicon germanium (SiGe), and the plurality of channel layers 224 comprise silicon (Si). In some embodiments, the plurality of semiconductor material layers 226 and corresponding plurality of channel layers 224 can comprise any number of lattice matched material pairs suitable for forming a superlattice structure 204. In some embodiments, the plurality of semiconductor material layers 226 and corresponding plurality of channel layers 224 comprise from about 2 to about 50 pairs of lattice matched materials. In some embodiments, the plurality of channel layers 224 may be doped with one or more of phosphorus (P), arsenic (As), boron (B), and gallium (Ga).

In one or more embodiments, the thickness of the plurality of semiconductor material layers 226 and the plurality of channel layers 224 are in the range of from about 2 nm to about 50 nm, in the range of from about 3 nm to about 20 nm, or in a range of from about 2 nm to about 15 nm.

In some embodiments, a dielectric material 246 is deposited on the substrate 200 using conventional chemical vapor deposition methods. In some embodiments, the dielectric material 246 is recessed below the top surface 202 of the substrate 200 so that the bottom portion of the superlattice structure 204 is formed from the substrate 200.

Referring to FIG. 2B, in some embodiments, a replacement gate structure (e.g., a dummy gate structure 208) is formed and patterned over the superlattice structure 204. The dummy gate structure 208 defines the channel region of the transistor device. The dummy gate structure 208 may be formed using any suitable conventional deposition and patterning process known in the art. The dummy gate structure 208 may comprise any suitable material known to one of skill in the art. In some embodiments, the dummy gate structure 208 comprises one or more of a dummy gate metal layer and a dummy gate polysilicon layer.

Referring to FIG. 2C, in some embodiments, sidewall spacers 210 are formed along outer sidewalls of the dummy gate structure 208. The sidewall spacers 210 of some embodiments comprise suitable insulating materials known in the art, for example, silicon nitride, silicon oxide, silicon oxynitride, silicon carbide, or the like. In some embodiments, the sidewall spacers 210 are formed using any suitable conventional deposition and patterning process known in the art, such as atomic layer deposition, plasma enhanced atomic layer deposition, plasma enhanced chemical vapor deposition or low-pressure chemical vapor deposition.

Referring to FIG. 2D, at operation 108, in some embodiments, a source trench 232 and a drain trench 234 are formed on either side of, adjacent to, the superlattice structure 204. In some embodiments, the source trench 232 is formed adjacent a first end of the superlattice structure 204 and the drain trench 234 is formed adjacent a second, opposing end of the superlattice structure 204. In the embodiment illustrated in FIG. 2D, one of the source trench 232 or drain trench 234 is not shown at the front face of the superlattice structure 204. The other end of the superlattice structure 204 has the other of the source trench 232 or drain trench 234.

Referring to FIG. 2E, at operation 110, a shallow trench isolation (STI) 250 is formed under the superlattice structure 204. As used herein, the term "shallow trench isolation (STI)" refers to an integrated circuit feature which prevents current leakage. In one or more embodiments, STI is created by depositing one or more dielectric materials (such as silicon dioxide) to fill a trench or opening and removing the excess dielectric using a technique such as chemical-mechanical planarization (CMP).

In one or more embodiments, an opening (not illustrated) is formed under the superlattice structure 204. In one or more embodiments, the opening may be formed by isotropically etching under the superlattice structure 204. In some embodiments, the superlattice structure 204 comprises alternating layers of silicon (Si) and silicon germanium (SiGe), such as the plurality of semiconductor material layers 226 and the corresponding plurality of channel layers 224, which are isotropically etched to form an opening under the superlattice structure 204.

Figures 2F, 2G, 2H, 2I:
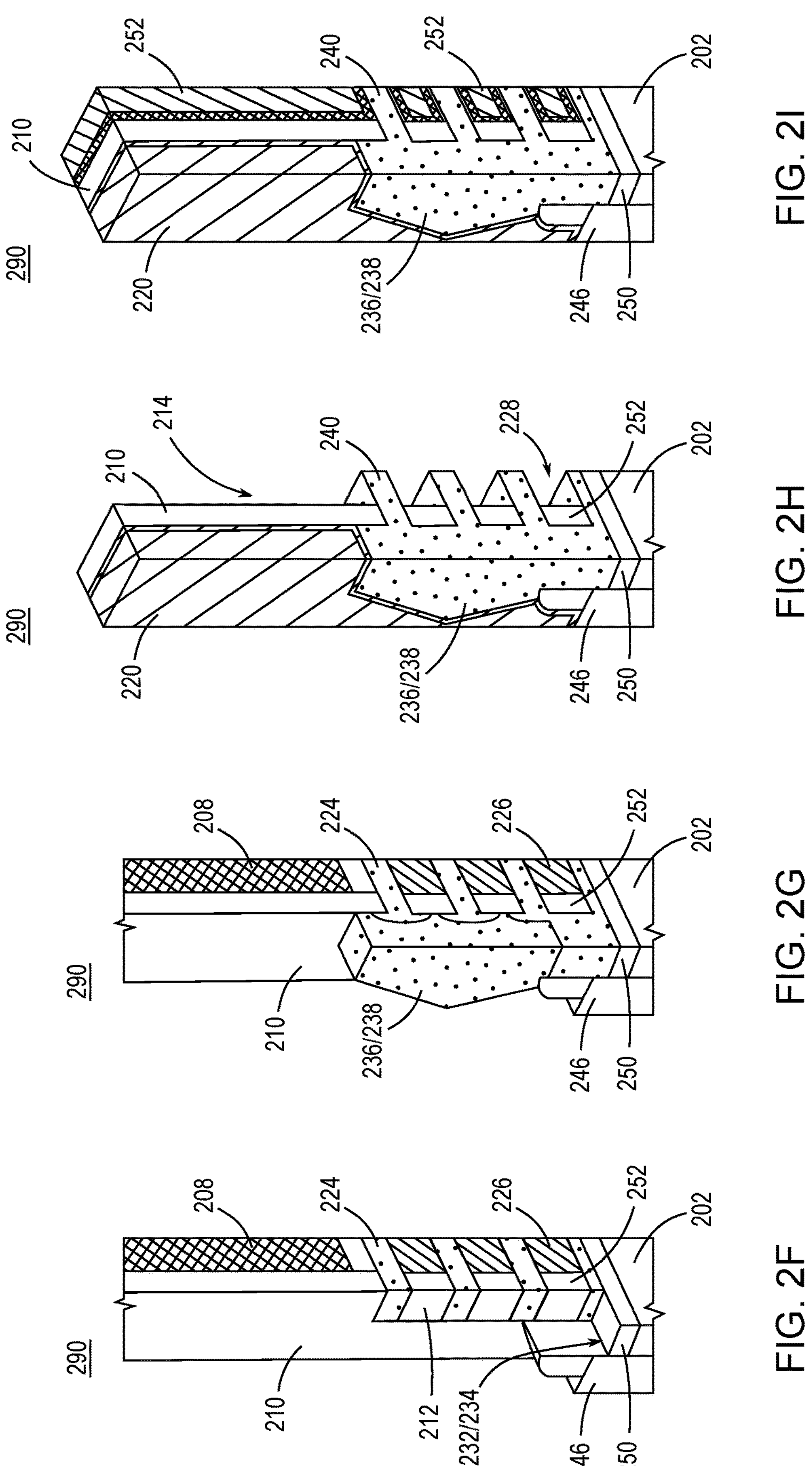
FIG. 2F illustrates a schematic cross-sectional view of an electronic device according to one or more embodiments.
FIG. 2G illustrates a schematic cross-sectional view of an electronic device according to one or more embodiments.
FIG. 2H illustrates a schematic cross-sectional view of an electronic device according to one or more embodiments.
FIG. 2I illustrates a schematic cross-sectional view of an electronic device according to one or more embodiments.
Figure 2J:
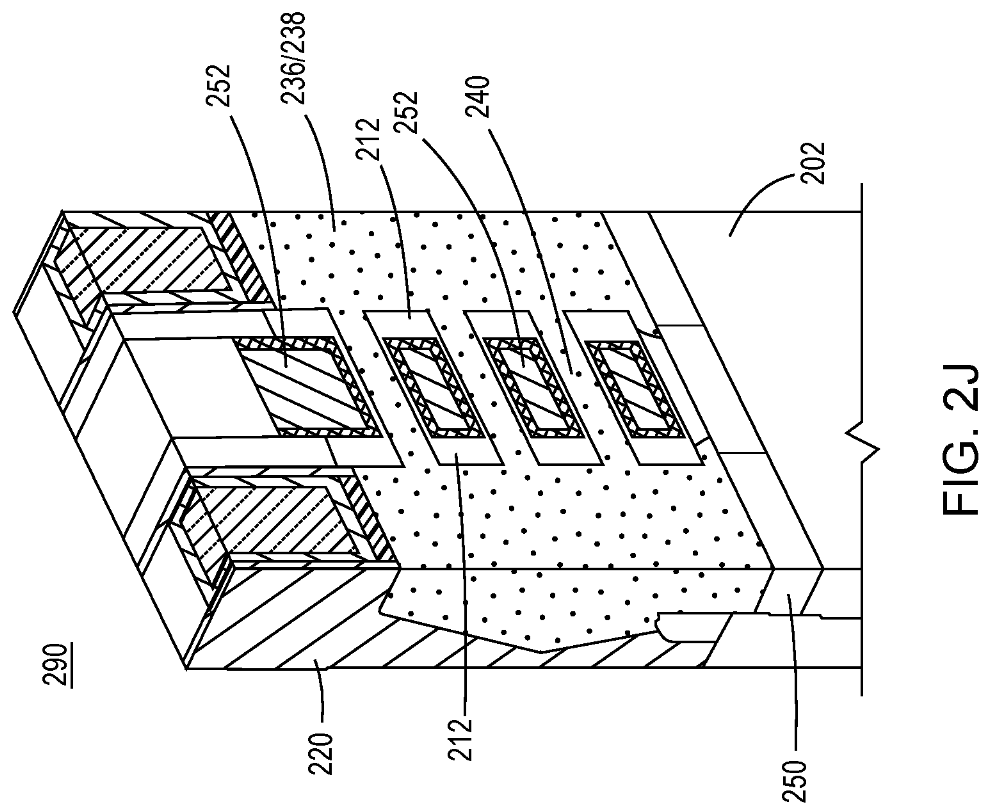
FIG. 2J illustrates a schematic cross-sectional view of a device according to one or more embodiments.

In operation 112, as shown in FIG. 2F, an inner spacer 212 is formed after selectively recessing the semiconductor material layers 226 from the source/drain trench 232/234. Embodiments of the present disclosure are directed to methods of forming an electronic device (e.g., method 100), including forming a multilayer inner spacer 212, at operation 112, as shown in FIGS. 3, 3A-3D, 4, and 4A-4F.

Embodiments of the present disclosure are directed to composite (multilayer) inner spacer configurations advantageously having overall lower effective capacitance ($C_{eff}$) while having high resistance to dry etch and wet etch processes.

Embodiments of the present disclosure are directed to composite (multilayer) inner spacer configurations under 3 nm GAA device dimensions advantageously having overall lower effective capacitance ($C_{eff}$) compared to traditional single layer inner spacers and traditional dual layer inner spacers in comparative GAA devices. The multilayer inner spacer described herein comprises an inner layer, a middle layer, and an outer layer. In some embodiments, one or more of the inner layer or the outer layer comprises a high-κ dielectric material, such as a high-κ dielectric material having a κ-value of greater than or equal to 6. In some embodiments, the middle layer comprises a low-κ dielectric material, such as a low-κ dielectric material having a κ-value of less than or equal to 4.2. For example, in embodiments where the inner layer has a thickness in a range of from 0.5 nm to 2 nm and comprises a high-κ dielectric material having a κ-value of 6, the middle layer has a thickness in a range of from 2 nm to 5 nm and comprises a low-κ dielectric material having a κ-value of 4.2, and the outer layer has a thickness in a range of from 0.5 nm to 2 nm and comprises a high-κ dielectric material having a κ-value of 6, the GAA device provides about 0.1792 femtofarads per micrometer (fF/μm).

Figure 3:
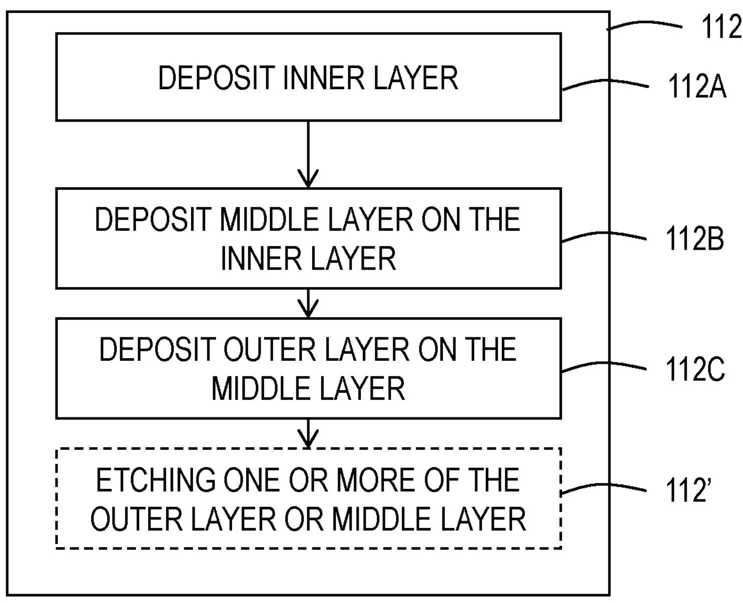
FIG. 3 illustrates a process flow diagram of a method of forming a multilayer inner spacer according to one or more embodiments.
Figures 3A, 3B:
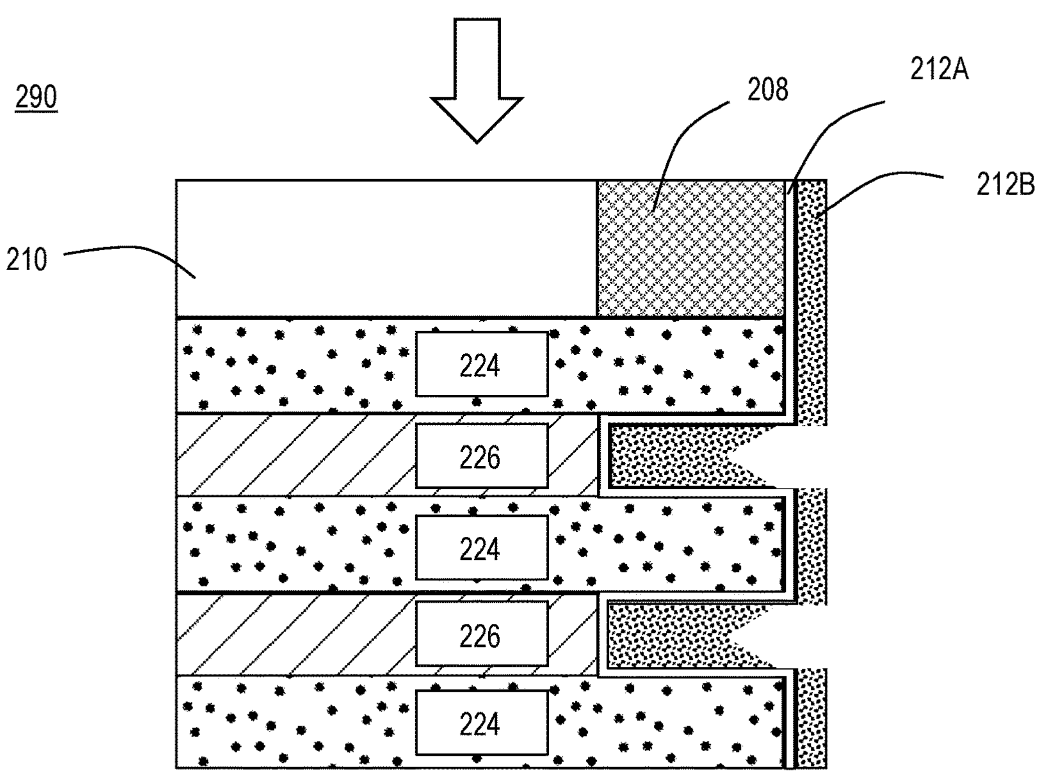
FIG. 3A illustrates a schematic cross-sectional view of a stage of manufacture of the multilayer inner spacer of FIG. 3 according to one or more embodiments.
FIG. 3B illustrates a schematic cross-sectional view of a stage of manufacture of the multilayer inner spacer of FIG. 3 according to one or more embodiments.
Figure 3C:
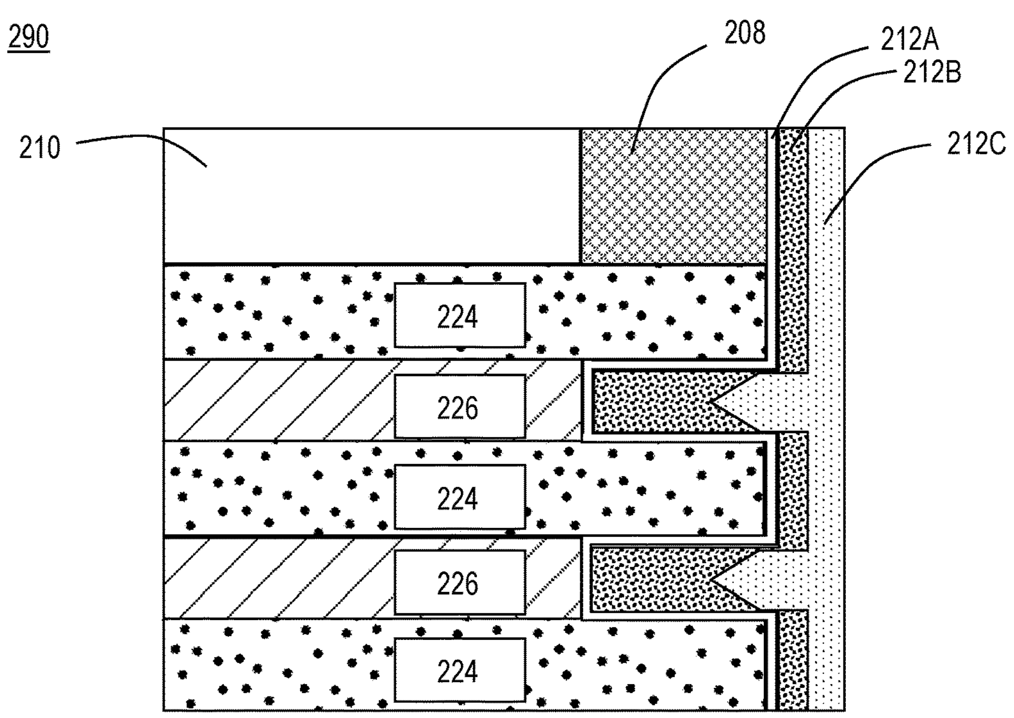
FIG. 3C illustrates a schematic cross-sectional view of a stage of manufacture of the multilayer inner spacer of FIG. 3 according to one or more embodiments.
Figure 3D:
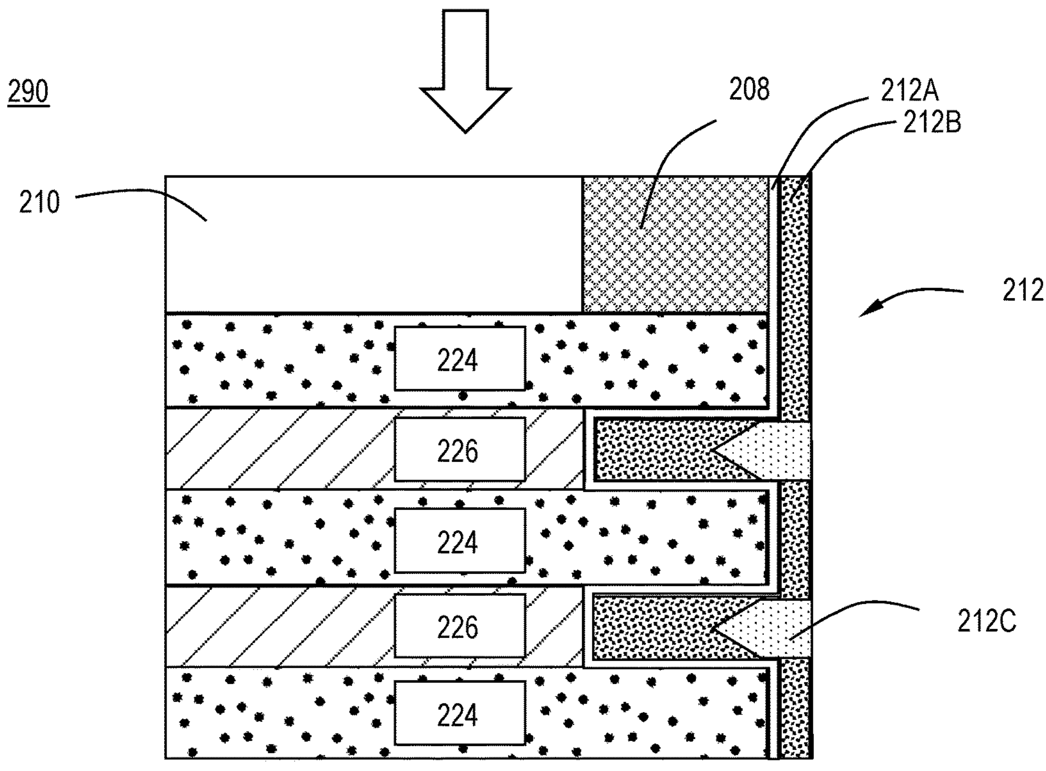
FIG. 3D illustrates a schematic cross-sectional view of a stage of manufacture of the multilayer inner spacer of FIG. 3 according to one or more embodiments.
Figure 4:
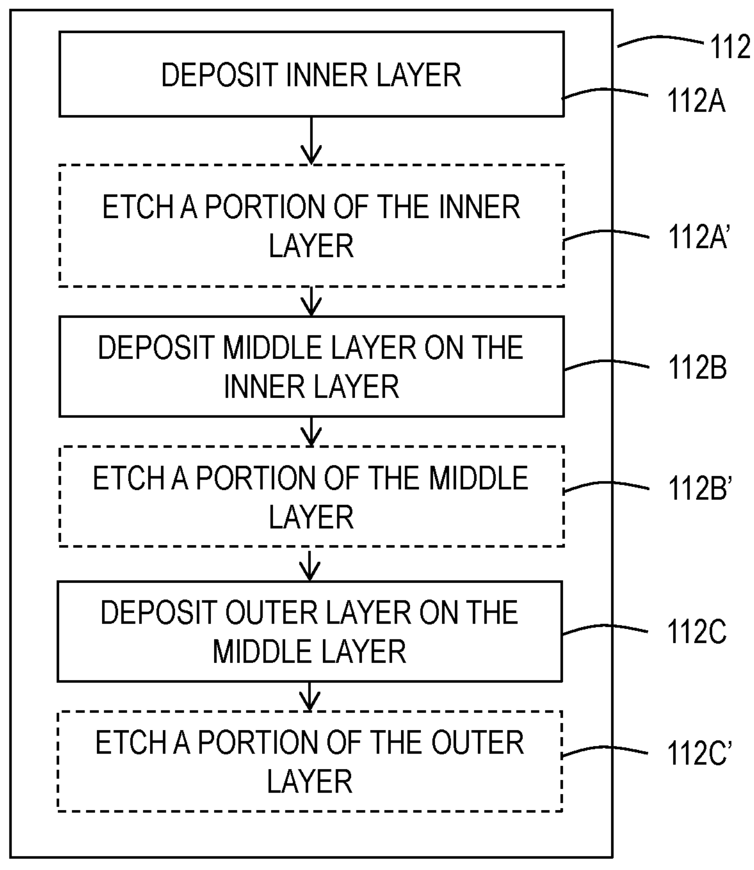
FIG. 4 illustrates a process flow diagram of a method of forming a multilayer inner spacer according to one or more embodiments.

FIGS. 3 and 4 illustrate process flow diagrams of methods of forming a multilayer inner spacer 212 (operation 112 of method 100) that may be used during the method 100 for forming an electronic device (e.g., the GAA device 290). FIGS. 3A-3D illustrates schematic cross-sectional views of the stages of manufacture of the multilayer inner spacer 212 of FIG. 3. FIGS. 4A-4F illustrate schematic cross-sectional views of the stages of manufacture of the multilayer inner spacer 212 of FIG. 4.

In some embodiments, the multilayer inner spacer 212 comprises an inner layer 212A, a middle layer 212B, and an outer layer 212C within the superlattice structure 204 formed on the top surface 202 of the substrate 200. In some embodiments, the superlattice structure 204 comprises a plurality of semiconductor material layers 226 and a corresponding plurality of channel layers 224 alternatingly arranged in a plurality of stacked pairs. The plurality of semiconductor material layers 226 comprises silicon germanium (SiGe) and the corresponding plurality of channel layers 224 comprises silicon (Si).

In some embodiments, forming the multilayer inner spacer, at operation 112, comprises: depositing the inner layer on a recessed portion of the plurality of semiconductor material layers (operation 112A); depositing the middle layer on the inner layer (operation 112B); and depositing the outer layer on the middle layer (operation 112C), the outer layer adjacent a source region and a drain region.

Referring to FIGS. 3 and 3A, in some embodiments, at operation 112A, the inner layer 212A is formed along the recessed portion of the plurality of semiconductor material layers 226. In some embodiments, the inner layer 212A is formed along the replacement gate structure (e.g., the dummy gate structure 208). The inner layer 212A may comprise any suitable insulating materials known in the art, for example, a high-κ dielectric material. In one or more embodiments, the high-κ dielectric material has a κ-value of greater than or equal to 6. In some embodiments, the high-κ dielectric material of the inner layer 212A comprises one or more of silicon nitride (SiN), silicon carbonitride (SiCN), or nitrogen-rich silicon oxycarbonitride (SiOCN). In some embodiments, the inner layer 212A is formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition. In some embodiments, the inner layer 212A has a thickness in a range of from 0.5 nm to 2 nm.

Referring to FIGS. 3 and 3B, in some embodiments, at operation 112B, a middle layer 212B is formed on the inner layer 212A. The middle layer 212B may comprise any suitable insulating materials known in the art, for example, a low-κ dielectric material. In one or more embodiments, the low-κ dielectric material has a κ-value of less than or equal to 4.2. In some embodiments, the low-κ dielectric material of the middle layer 212B comprises one or more of silicon (Si), silicon oxide (SiOx), doped silicon, doped silicon oxide, or spin-on dielectrics. In some embodiments, the middle layer 212B is formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition. In some embodiments, the middle layer 212B has a thickness in a range of from 2 nm to 5 nm.

Referring to FIGS. 3 and 3C, in some embodiments, at operation 112C, an outer layer 212C is formed on the middle layer 212B, the outer layer 212C adjacent a source region and a drain region, 236/238, described further below. The outer layer 212C may comprise any suitable insulating materials known in the art, for example, a high-κ dielectric material. In one or more embodiments, the high-κ dielectric material has a κ-value of greater than or equal to 6. In some embodiments, the high-κ dielectric material of the outer layer 212C comprises one or more of silicon nitride (SiN), silicon carbonitride (SiCN), or nitrogen-rich silicon oxycarbonitride (SiOCN). In some embodiments, the outer layer 212C is formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition. In some embodiments, the outer layer 212C has a thickness in a range of from 0.5 nm to 2 nm.

In some embodiments, the multilayer inner spacer 212 (e.g., the inner layer 212A, the middle layer 212B, and the outer layer 212C) is formed by a thermal chemical vapor deposition process at a temperature in a range of from 400° C. to 650° C., including all subranges and values therebetween.

In some embodiments, the multilayer inner spacer 212 (e.g., the inner layer 212A, the middle layer 212B, and the outer layer 212C) is deposited conformally. As used herein, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate. In some embodiments, the multilayer inner spacer 212 (e.g., the inner layer 212A, the middle layer 212B, and the outer layer 212C) is deposited by a thermal chemical vapor deposition process having a conformality in a range of from 70% to 90%. As used in this regard, "conformality in a range of from 70% to 90%" means that the ratio of the average thickness of the stated layer(s) deposited on the sidewalls of a feature to the average thickness of the same deposited layer on the field, or upper surface, of the substrate is in a range of 70% to 90%.

The multilayer inner spacer 212 (e.g., the inner layer 212A, the middle layer 212B, and the outer layer 212C) can be any suitable shape, including, but not limited to, round, square, rectangular, or any other polygonal shape.

In some embodiments, the multilayer inner spacer 212 (e.g., the inner layer 212A, the middle layer 212B, and the outer layer 212C) is substantially free of seams and/or voids. As used in this regard, “substantially free” means that less than about 5%, including less than about 4%, less than about 3%, less than about 2%, less than about 1%, less than about 0.5%, and less than about 0.1% of the total composition of the multilayer inner spacer 212 (e.g., the inner layer 212A, the middle layer 212B, and the outer layer 212C) on an atomic basis, comprises seams and/or voids.

The etch process of operation 112' may include any suitable etch process that is selective to the multilayer inner spacer 212 (e.g., the inner layer 212A, the middle layer 212B, and the outer layer 212C). In some embodiments, the etch process of operation 112' comprises one or more of a wet etch process or a dry etch process.

In some embodiments, the dry etch process may include a conventional plasma etch, or a remote plasma-assisted dry etch process, such as a SiCoNi™ etch process, available from Applied Materials, Inc., located in Santa Clara, California. In a SiCoNi™ etch process, the device is exposed to $H_2$, $NF_3$, and/or NHs plasma species, e.g., plasma-excited hydrogen and fluorine species. For example, in some embodiments, the device may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, including the Centura®, Dual ACP, Producer® GT, and Endura® platform, available from Applied Materials®. The wet etch process may include a hydrofluoric (HF) acid last process, i.e., the so-called “HF last” process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Embodiments of the present disclosure are directed to composite (multilayer) inner spacer configurations under 3 nm GAA device dimensions advantageously having overall lower effective capacitance ($C_{eff}$) compared to traditional single layer inner spacers and traditional dual layer inner spacers in comparative GAA devices. For example, in embodiments where the inner layer 212A has a thickness in a range of from 0.5 nm to 2 nm and comprises a high-κ dielectric material having a κ-value of 6, the middle layer 212B has a thickness in a range of from 2 nm to 5 nm and comprises a low-κ dielectric material having a κ-value of 4.2, and the outer layer 212C has a thickness in a range of from 0.5 nm to 2 nm and comprises a high-κ dielectric material having a κ-value of 6, the GAA device provides about 0.1792 femtofarads per micrometer (fF/μm).

Figure 4A:
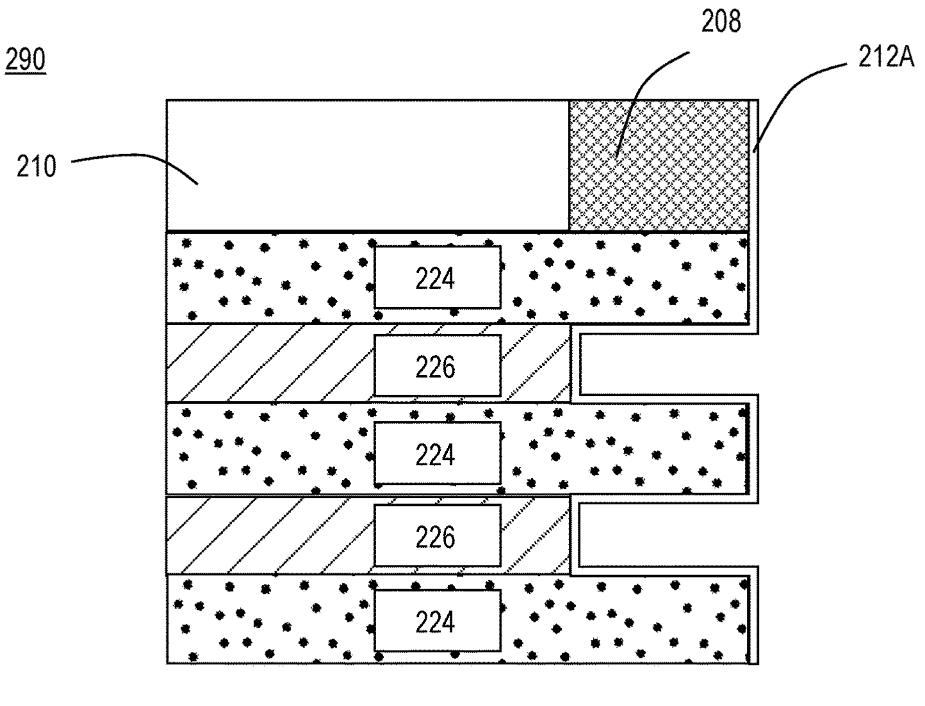
FIG. 4A illustrates a schematic cross-sectional view of a stage of manufacture of the multilayer inner spacer of FIG. 4 according to one or more embodiments.
Figure 4B:
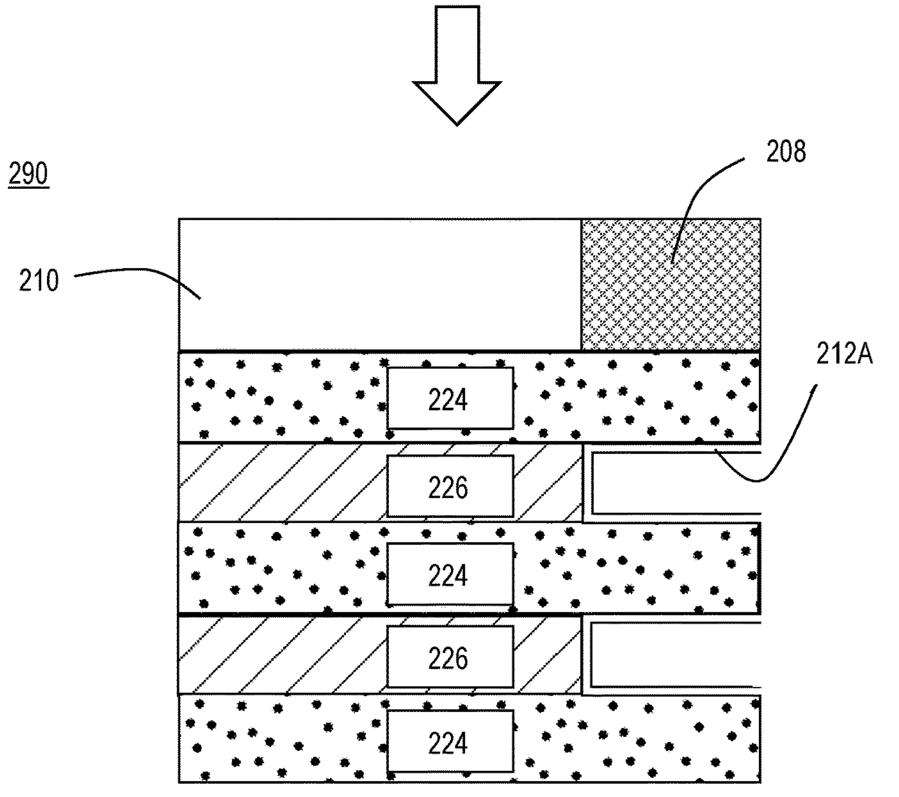
FIG. 4B illustrates a schematic cross-sectional view of a stage of manufacture of the multilayer inner spacer of FIG. 4 according to one or more embodiments.
Figure 4C:
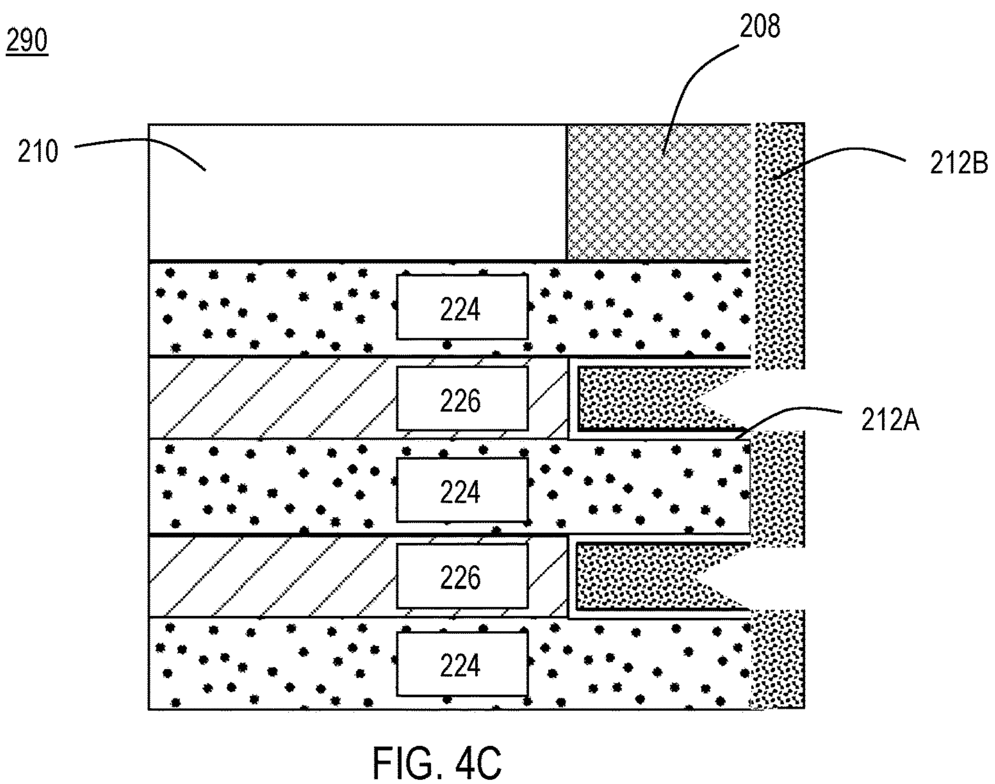
FIG. 4C illustrates a schematic cross-sectional view of a stage of manufacture of the multilayer inner spacer of FIG. 4 according to one or more embodiments.
Figure 4D:
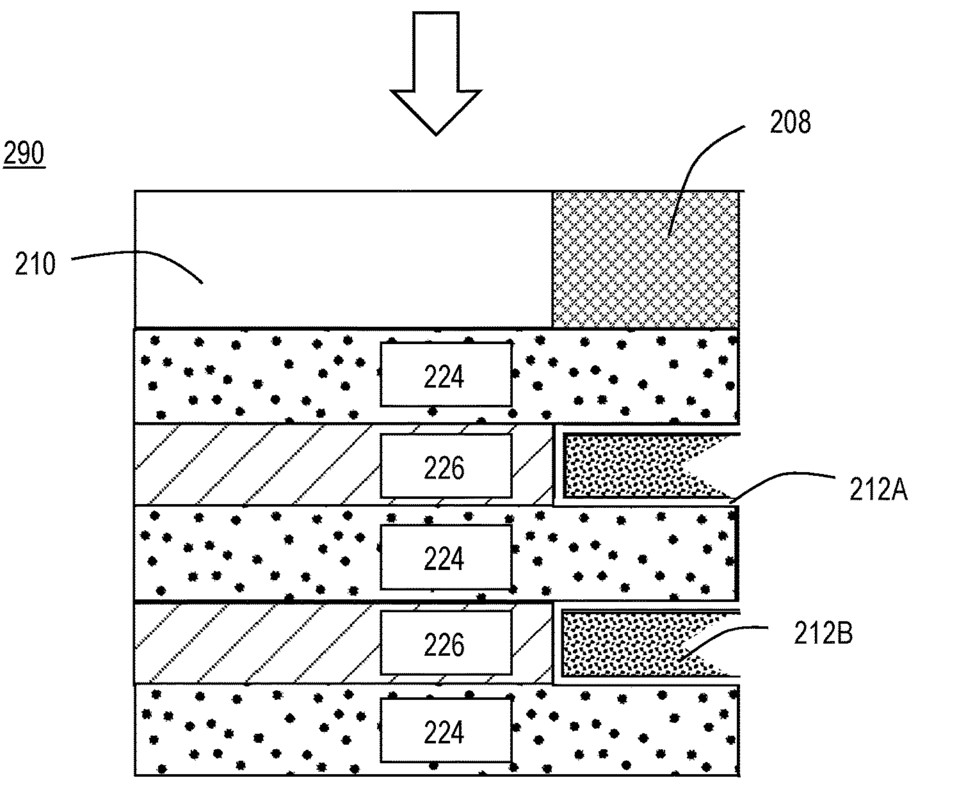
FIG. 4D illustrates a schematic cross-sectional view of a stage of manufacture of the multilayer inner spacer of FIG. 4 according to one or more embodiments.
Figure 4E:
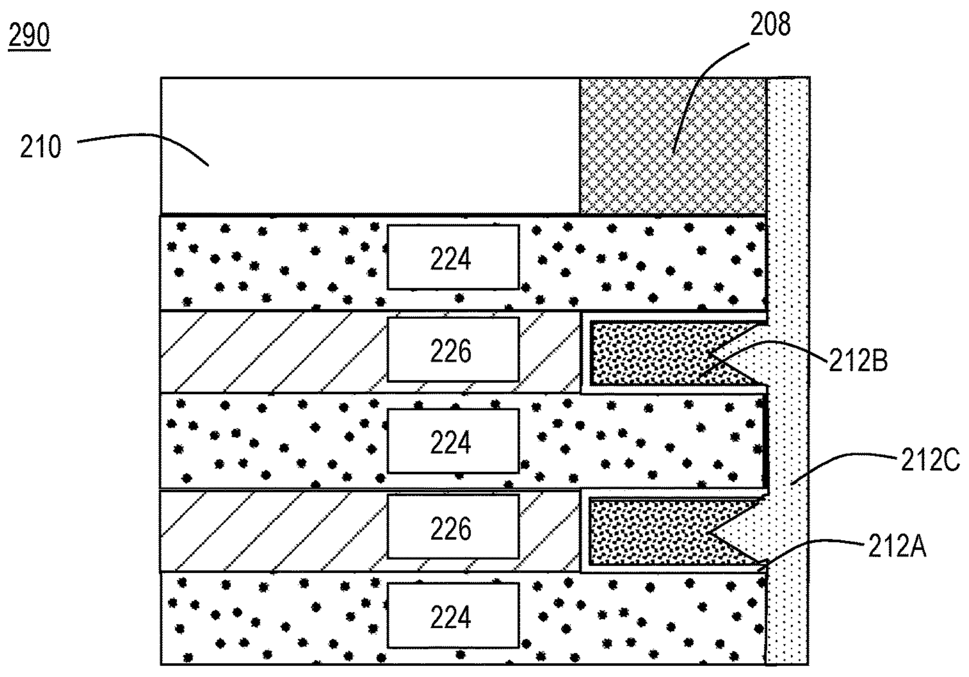
FIG. 4E illustrates a schematic cross-sectional view of a stage of manufacture of the multilayer inner spacer of FIG. 4 according to one or more embodiments.
Figure 4F:
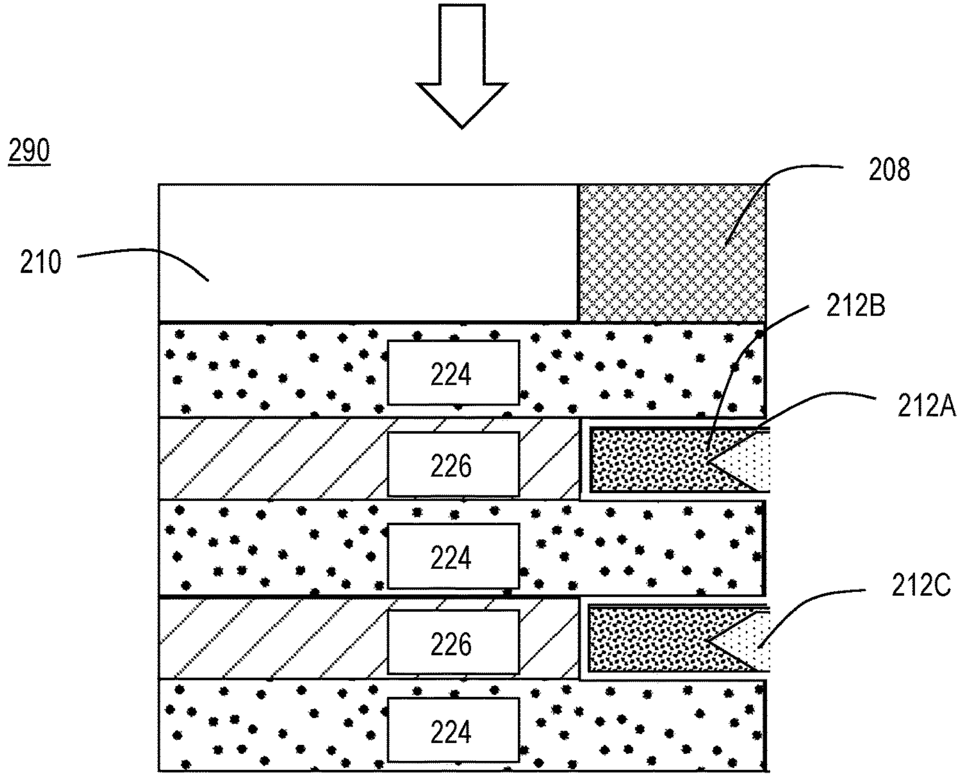
FIG. 4F illustrates a schematic cross-sectional view of a stage of manufacture of the multilayer inner spacer of FIG. 4 according to one or more embodiments.

FIGS. 4 and 4A-4F illustrate another embodiment of forming the multilayer inner spacer (operation 112). FIGS. 4A-4F illustrate schematic cross-sectional views of the stages of manufacture of the multilayer inner spacer 212 of FIG. 4. FIG. 4A illustrates depositing the inner layer on the recessed portion of the plurality of semiconductor material layers (112A). FIG. 4B illustrates etching a portion of the inner layer (operation 112A'). FIG. 4C illustrates depositing the middle layer on the inner layer (operation 112B). FIG. 4D illustrates etching a portion of the middle layer (operation 112B'). FIG. 4E illustrates depositing the outer layer on the middle layer (operation 112C). FIG. 4F illustrates etching a portion of the outer layer (operation 112C'). The deposition operations 112A, 112B, and 112C of FIG. 4, may be the same as deposition operations 112A, 112B, and 112C of FIG. 3. The etch process of operations 112A', 112B', and 112C' of FIG. 4 may be the same as the etch process of operation 112' of FIG. 3.

Figure 5:
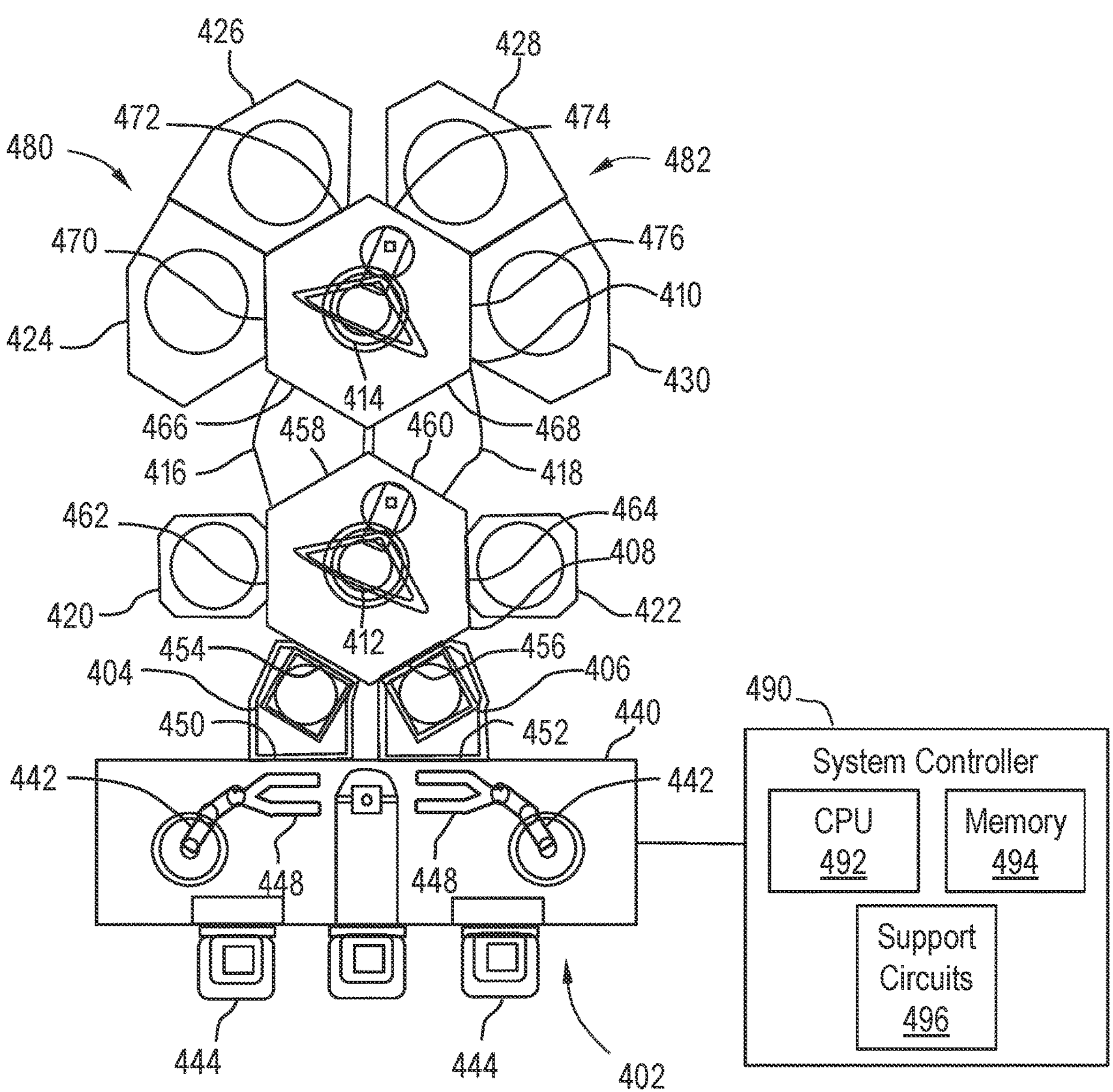
FIG. 5 illustrates a schematic top-view diagram of an example multi-chamber processing system for forming an electronic device according to one or more embodiments.

Additional embodiments of the disclosure are directed to processing systems 400 for the formation of the multilayer inner spacers 212 for the GAA devices 290 and methods described, as shown in FIG. 5. Examples of a processing system that may be suitably modified in accordance with the teachings provided herein, include the Centura®, Dual ACP, Producer® GT, and Endura® platform, commercially available from Applied Materials® in Santa Clara, California, as well as other processing systems may be utilized. It is contemplated that other processing systems (including those from other manufacturers) may be adapted to benefit from aspects described herein.

The processing system 400 may include any dielectric deposition product (DDP) that is commercially available from Applied Materials® in Santa Clara, California. In some embodiments, the processing system 400 includes a low-κ silicon oxycarbide (SiOC) dielectric chemical vapor deposition (CVD) chamber. In some embodiments, the processing system 400 includes advanced unit process solutions through combining the low-κ silicon oxycarbide (SiOC) dielectric chemical vapor deposition (CVD) chamber with Sym3® Etch System, commercially available from Applied Materials® in Santa Clara, California, providing an integrated tool solution (e.g., an integrated cyclic-CVD deposition-and-etch processing system). In some embodiments, the processing system 400 includes an integrated module for forming the multilayer inner spacer (operation 112 of method 100). In some embodiments, the processing system 400 is also particularly useful in 3D memory horizontal wordline applications and for forming contact/sidewall spacers.

Without intending to be bound by theory, it is thought that lower growth rates lead to conformal growth whereas higher growth rates (e.g., above about 1 Å/cycle) tend to grow non-conformal films. Growth rates (also referred to as deposition rates) are expressed as an average thickness deposited per cycle. Advantageously, the processing system 400 provides atomic layer deposition (ALD) type conformal growth and higher growth rate of chemical vapor deposition (CVD) techniques.

In some embodiments, the operations of the methods described herein are each performed within the same processing chamber. In some embodiments, the operations of the methods described herein are each performed within a different processing chamber. In some embodiments, the different processing chambers are connected as part of a processing system. In some embodiments, the operations of the methods described herein are performed without an intervening vacuum break.

In some embodiments, one or more of the operations of the methods of this disclosure is performed in situ, as described herein. In some embodiments, one or more of the operations of the methods of this disclosure is performed ex situ, as described herein.

FIG. 5 illustrates a schematic top-view diagram of an example of a multi-chamber processing system 400 according to embodiments of the present disclosure. The processing system 400 generally includes a factory interface 402, load lock chambers 404, 406, transfer chambers 408, 410 with respective transfer robots 412, 414, holding chambers 416, 418, and processing chambers 420, 422, 424, 426, 428, 430. As detailed herein, wafers in the processing system 400 can be processed in and transferred between the various chambers without exposing the wafers to an ambient environment exterior to the processing system 400 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 400. Accordingly, the processing system 400 may provide for an integrated solution for some processing of wafers.

In the illustrated example of FIG. 5, the factory interface 402 includes a docking station 440 and factory interface robots 442 to facilitate transfer of wafers. The docking station 440 is configured to accept one or more front opening unified pods (FOUPs) 444. In some examples, each factory interface robot 442 generally comprises a blade 448 disposed on one end of the respective factory interface robot 442 configured to transfer the wafers from the factory interface 402 to the load lock chambers 404, 406.

The load lock chambers 404, 406 have respective ports 450, 452 coupled to the factory interface 402 and respective ports 454, 456 coupled to the transfer chamber 408. The transfer chamber 408 further has respective ports 458, 460 coupled to the holding chambers 416, 418 and respective ports 462, 464 coupled to processing chambers 420, 422. Similarly, the transfer chamber 410 has respective ports 466, 468 coupled to the holding chambers 416, 418 and respective ports 470, 472, 474, 476 coupled to processing chambers 424, 426, 428, 430. The ports 454, 456, 458, 460, 462, 464, 466, 468, 470, 472, 474, 476 can be, for example, slit valve openings with slit valves for passing wafers therethrough by the transfer robots 412, 414 and for providing a seal between respective chambers to prevent a gas from passing between the respective chambers. Generally, any port is open for transferring a wafer therethrough. Otherwise, the port is closed.

The load lock chambers 404, 406, transfer chambers 408, 410, holding chambers 416, 418, and processing chambers 420, 422, 424, 426, 428, 430 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 442 transfers a wafer from a FOUP 444 through a port 450 or 452 to a load lock chamber 404 or 406. The gas and pressure control system then pumps down the load lock chamber 404 or 406. The gas and pressure control system further maintains the transfer chambers 408, 410 and holding chambers 416, 418 with an interior low pressure or vacuum environment (which may include an inert gas). Hence, the pumping down of the load lock chamber 404 or 406 facilitates passing the wafer between, for example, the atmospheric environment of the factory interface 402 and the low pressure or vacuum environment of the transfer chamber 408.

With the wafer in the load lock chamber 404 or 406 that has been pumped down, the transfer robot 412 transfers the wafer from the load lock chamber 404 or 406 into the transfer chamber 408 through the port 454 or 456. The transfer robot 412 is then capable of transferring the wafer to and/or between any of the processing chambers 420, 422 through the respective ports 462, 464 for processing and the holding chambers 416, 418 through the respective ports 458, 460 for holding to await further transfer. Similarly, the transfer robot 414 is capable of accessing the wafer in the holding chamber 416 or 418 through the port 466 or 468 and is capable of transferring the wafer to and/or between any of the processing chambers 424, 426, 428, 430 through the respective ports 470, 472, 474, 476 for processing and the holding chambers 416, 418 through the respective ports 466, 468 for holding to await further transfer. The transfer and holding of the wafer within and among the various chambers can be in the low pressure or vacuum environment provided by the gas and pressure control system.

The processing chambers 420, 422, 424, 426, 428, 430 can be any appropriate chamber for processing a wafer. In some embodiments, the processing chamber 420 can be capable of performing an annealing process, the processing chamber 422 can be capable of performing a cleaning process, and the processing chambers 424, 426, 428, 430 can be capable of performing epitaxial growth processes. In some examples, the processing chamber 422 can be capable of performing a cleaning process, the processing chamber 420 can be capable of performing an etch process, and the processing chambers 424, 426, 428, 430 can be capable of performing respective epitaxial growth processes. The processing chamber 422 may be a SiCoNi™ Preclean chamber available from Applied Materials of Santa Clara, Calif. The processing chamber 420 may be a Selectra™ Etch chamber available from Applied Materials of Santa Clara, Calif.

A system controller 490 is coupled to the processing system 400 for controlling the processing system 400 or components thereof. For example, the system controller 490 may control the operation of the processing system 400 using a direct control of the chambers 404, 406, 408, 416, 418, 410, 420, 422, 424, 426, 428, 430 of the processing system 400 or by controlling controllers associated with the chambers 404, 406, 408, 416, 418, 410, 420, 422, 424, 426, 428, 430. In operation, the system controller 490 enables data collection and feedback from the respective chambers to coordinate performance of the processing system 400.

The system controller 490 generally includes a central processing unit (CPU) 492, memory 494, and support circuits 496. The CPU 492 may be one of any form of a general-purpose processor that can be used in an industrial setting. The memory 494, or non-transitory computer-readable medium, is accessible by the CPU 492 and may be one or more of memory such as random-access memory (RAM), read only memory (ROM), floppy disk, hard disk, or any other form of digital storage, local or remote. The support circuits 496 are coupled to the CPU 492 and may comprise cache, clock circuits, input/output subsystems, power supplies, and the like. The various methods disclosed herein may generally be implemented under the control of the CPU 492 by the CPU 492 executing computer instruction code stored in the memory 494 (or in memory of a particular process chamber) as, for example, a software routine. When the computer instruction code is executed by the CPU 492, the CPU 492 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 408, 410 and the holding chambers 416, 418. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 490 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

One or more embodiments of the disclosure are directed to a non-transitory computer readable medium including instructions, that, when executed by a controller of a processing chamber, cause the processing chamber to perform the methods described herein.

In some embodiments, after forming the multilayer inner spacer 212 comprising the inner layer 212A, the middle layer 212B, and the outer layer 212C, the method 100 continues to form subsequent components of the GAA device 290.

In operation 114, the source region 236 and/or the drain region 238 are formed in the source/drain trench 232/234. In some embodiments, the outer layer 212C is adjacent the source region 236 and the drain region 238. In other embodiments, the inner layer 212A is adjacent the source region 236 and the drain region 238. In some embodiments, the source region 236 and/or drain region 238 are formed from any suitable semiconductor material, such as but not limited to silicon, germanium, silicon germanium, silicon phosphorous, silicon arsenic, or the like. In one or more embodiments, the source region 236 and the drain region 238 may independently be doped with one or more of phosphorus (P), arsenic (As), boron (B), and gallium (Ga).

In some embodiments, the source region 236 and drain region 238 may be formed using any suitable deposition process, such as an epitaxial deposition process.

Referring to FIG. 2H, in some embodiments, an interlayer dielectric (ILD) layer 220 is blanket deposited over the source/drain regions 236/238, the dummy gate structure 208, and the sidewall spacers 210. The ILD layer 220 may be deposited using a conventional chemical vapor deposition method (e.g., plasma enhanced chemical vapor deposition and low-pressure chemical vapor deposition). In one or more embodiments, ILD layer 220 is formed from any suitable dielectric material such as, but not limited to, undoped silicon oxide, doped silicon oxide (e.g., BPSG, PSG), silicon nitride, and silicon oxynitride. In one or more embodiments, ILD layer 220 is then polished back using a conventional chemical mechanical planarization (CMP) method to expose the top of the dummy gate structure 208. In some embodiments, the ILD layer 220 is polished to expose the top of the dummy gate structure 208 and the top of the sidewall spacers 210.

In operation 116, as shown in FIG. 2H, the dummy gate structure 208 is removed to expose the channel region 214 of the superlattice structure 204. The ILD layer 220 protects the source/drain regions 236/238 during the removal of the dummy gate structure 208. The dummy gate structure 208 may be removed using any conventional etching method such as a plasma dry etch or a wet etch. In some embodiments, the dummy gate structure 208 comprises poly-silicon and the dummy gate structure 208 is removed by a selective etch process. In some embodiments, the dummy gate structure 208 comprises polysilicon and the superlattice structure 204 comprises alternating layers of silicon (Si) and silicon germanium (SiGe).

In operation 116, as shown in FIG. 2H, the plurality of semiconductor material layers 226 are selectively etched between the plurality of channel layers 224 in the superlattice structure 204. For example, where the superlattice structure 204 is composed of silicon (Si) layers and silicon germanium (SiGe) layers, the silicon germanium (SiGe) is selectively etched to form channel nanowires 240. The plurality of semiconductor material layers 226, for example silicon germanium (SiGe), may be removed using any well-known etchant that is selective to the plurality of channel layers 224, for example silicon (Si), where the etchant etches the plurality of semiconductor material layers 226 at a significantly higher rate than the plurality of channel layers 224. In some embodiments, a selective dry etch or wet etch process may be used. In some embodiments, where the plurality of channel layers 224 are silicon (Si) and the plurality of semiconductor material layers 226 are silicon germanium (SiGe), the layers of silicon germanium may be selectively removed using a wet etchant such as, but not limited to aqueous carboxylic acid/nitric acid/HF solution and aqueous citric acid/nitric acid/HF solution.

In one or more embodiments, as illustrated in FIG. 2H, the removal of the plurality of semiconductor material layers 226 leaves voids 228 between the plurality of channel layers 224. The voids 228 between the plurality of channel layers 224 have a thickness of about 3 nm to about 20 nm. The remaining channel layers 224 form a vertical array of channel nanowires 240 that are coupled to the source/drain regions 232, 234. The channel nanowires 240 run parallel to the top surface of the substrate 200 and are aligned with each other to form a single column of channel nanowires 240. The formation of the source region 236 and drain region 238 and the formation of an optional lateral etch stop layer advantageously provide self-alignment and structural integrity in the formation of the channel structure.

The isotropic etch process may include any suitable etch process that is selective to the semiconductor material of the plurality of channel layers 224. In some embodiments the isotropic etch process of operation 116 comprises one or more of a wet etch process or a dry etch process. In some embodiments, the isotropic etch process of operation 116 comprises a dry etch process.

In one or more embodiments, operation 118 of method 100 represents one or more processes known to the skilled artisan for completion of the hGAA device, e.g., replacement metal gate formation. For example, in one or more unillustrated embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (Tin), tungsten (W), cobalt (Co), aluminum (Al), or the like is deposited on the high-k dielectric. The conductive material may be formed using any suitable deposition process such as, but not limited to, atomic layer deposition (ALD) in order to ensure the formation of a layer having a uniform thickness around each of the plurality of channel layers 224.

In one or more embodiments, as illustrated in FIG. 2I, a gate electrode 252 is formed in the voids 228 between the plurality of channel layers 224. The gate electrode may be formed from any suitable gate electrode material known in the art. The gate electrode material is deposited using any suitable deposition process such as atomic layer deposition (ALD) to ensure that gate electrode is formed around and between each of the plurality of channel layers 224. In one or more embodiments, the gate electrode is deposited by CVD because there is limited space available between the nanosheets for the gate electrode to fit. In one or more embodiments, the gate electrode 252 comprises one or more of titanium nitride (TiN), tantalum nitride (TaN), tungsten (W), and titanium-aluminum (TiAl) and its compounds, including but not limited to titanium-aluminum-carbide (TiAlC), titanium-aluminum-oxide (TiAlO), titanium-aluminum-oxide-nitride (TiAlON), titanium-aluminum-carbon-chloride (TiAlCCl), and the like. In some embodiments, the gate electrode 252 comprises a void.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of manufacturing an electronic device, the method comprising:

forming a multilayer inner spacer comprising an inner layer, a middle layer, and an outer layer within a superlattice structure formed on a top surface of a substrate, the superlattice structure comprising a plurality of semiconductor material layers and a corresponding plurality of channel layers alternatingly arranged in a plurality of stacked pairs, the plurality of semiconductor material layers comprising silicon germanium (SiGe) and the corresponding plurality of channel layers comprising silicon (Si), forming the multilayer inner spacer comprising a thermal chemical vapor deposition (CVD) process at a temperature in a range of from 400° C. to 650° C., the thermal CVD process comprising:

depositing the inner layer on a recessed portion of the plurality of semiconductor material layers;

depositing the middle layer on the inner layer; and depositing the outer layer on the middle layer, the outer layer adjacent a source region and a drain region, wherein one or more of the inner layer or the outer layer has a thickness in a range of from 0.5 nm to 2 nm and the middle layer has a thickness in a range of from 2 nm to 5 nm.

2. The method of claim 1, wherein one or more of the inner layer or the outer layer comprises a high-κ dielectric material.

3. The method of claim 2, wherein the high-κ dielectric material has a κ-value of greater than or equal to 6.

4. The method of claim 2, wherein the high-κ dielectric material comprises one or more of silicon nitride (SiN), silicon carbonitride (SiCN), or nitrogen-rich silicon oxycarbonitride (SiOCN).

5. The method of claim 1, wherein the middle layer comprises a low-κ dielectric material.

6. The method of claim 5, wherein the low-κ dielectric material has a κ-value of less than or equal to 4.2.

7. The method of claim 5, wherein the low-κ dielectric material comprises one or more of silicon (Si), silicon oxide (SiOx), doped silicon, doped silicon oxide, or spin-on dielectrics.

8. The method of claim 1, wherein the multilayer inner spacer is substantially free of seams and/or voids.

9. The method of claim 1, wherein the electronic device is a gate-all-around (GAA) device.

10. The method of claim 1, further comprising etching one or more of the outer layer or the middle layer.

11. A method of manufacturing an electronic device, the method comprising:

forming a multilayer inner spacer comprising an inner layer, a middle layer, and an outer layer within a superlattice structure formed on a top surface of a substrate, the superlattice structure comprising a plurality of semiconductor material layers and a corresponding plurality of channel layers alternatingly arranged in a plurality of stacked pairs, the plurality of semiconductor material layers comprising silicon germanium (SiGe) and the corresponding plurality of channel layers comprising silicon (Si), forming the multilayer inner spacer comprising:

depositing the inner layer on a recessed portion of the plurality of semiconductor material layers;

optionally etching the inner layer;

depositing the middle layer on the inner layer;

etching a portion of the middle layer;

depositing the outer layer on the middle layer, the outer layer adjacent a source region and a drain region; and etching the outer layer, wherein the inner layer, the middle layer, and the outer layer are each deposited by a thermal chemical vapor deposition process at a temperature in a range of from 400° C. to 650° C., one or more of the inner layer or the outer layer has a thickness in a range of from 0.5 nm to 2 nm, and the middle layer has a thickness in a range of from 2 nm to 5 nm.

12. The method of claim 11, performed in situ in an integrated deposition and etch processing system.

13. The method of claim 11, wherein one or more of the inner layer or the outer layer comprises a high-κ dielectric material.

14. The method of claim 11, wherein the middle layer comprises a low-κ dielectric material.

15. The method of claim 11, wherein the multilayer inner spacer is substantially free of seams and/or voids.

16. A processing tool comprising:

a central transfer station comprising a robot configured to move a substrate;

a plurality of process stations, each process station connected to the central transfer station and providing a processing region separated from processing regions of adjacent process stations, the plurality of process stations comprising a chemical vapor deposition (CVD) chamber and an etch chamber; and a controller connected to the central transfer station and the plurality of process stations, the controller configured to activate the robot to move the substrate between process stations, and to control a process cycle for manufacturing a multilayer inner spacer for a gate-all-around (GAA) device, the multilayer inner spacer comprising an inner layer, a middle layer, and an outer layer within a superlattice structure formed on a top surface of the substrate, the superlattice structure comprising a plurality of semiconductor material layers and a corresponding plurality of channel layers alternatingly arranged in a plurality of stacked pairs, the plurality of semiconductor material layers comprising silicon germanium (SiGe) and the corresponding plurality of channel layers comprising silicon (Si), the process cycle comprising forming the multilayer inner spacer by a thermal chemical vapor deposition (CVD) process at a temperature in a range of from 400° C. to 650° C., the thermal CVD process including:

depositing the inner layer on a recessed portion of the plurality of semiconductor material layers; depositing the middle layer on the inner layer; and depositing the outer layer on the middle layer, the outer layer adjacent a source region and a drain region, wherein one or more of the inner layer or the outer layer has a thickness in a range of from 0.5 nm to 2 nm and the middle layer has a thickness in a range of from 2 nm to 5 nm.

* * * * *